US010854416B1

(12) United States Patent
McLaughlin et al.

(10) Patent No.: US 10,854,416 B1
(45) Date of Patent: Dec. 1, 2020

(54) THERMALLY ISOLATED REPELLER AND ELECTRODES

(71) Applicant: Applied Materials, Inc., Santa Clara, CA (US)

(72) Inventors: Adam M. McLaughlin, Merrimac, MA (US); Craig R. Chaney, Gloucester, MA (US); Jordan B. Tye, Arlington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/565,805

(22) Filed: Sep. 10, 2019

(51) Int. Cl.
*H01J 37/08* (2006.01)
*H01J 11/28* (2012.01)
*H01J 27/02* (2006.01)

(52) U.S. Cl.
CPC .................................. *H01J 27/022* (2013.01)

(58) Field of Classification Search
CPC .......... H01J 37/08; H01J 27/024; H01J 11/28; H01J 27/14; H01J 37/02; H01J 37/04; H01J 37/32541; H01J 37/3417; H01J 37/3423
USPC ............................ 250/423 R, 424, 426, 427
See application file for complete search history.

(56) References Cited

U.S. PATENT DOCUMENTS 5,262,652 A * 11/1993 Bright .................. H01J 27/022 250/423 R
5,497,005 A * 3/1996 Medulla .................. H01J 27/22 250/423 R
8,702,920 B2 * 4/2014 Ikejiri .................. H01J 27/022 204/298.12
9,299,529 B2 * 3/2016 Tanjo ...................... H01J 37/08
9,530,615 B2 * 12/2016 Kurunczi .............. B08B 7/0021
9,633,824 B2 * 4/2017 Nguyen .............. H01J 37/3417
9,711,316 B2 * 7/2017 Leavitt .................. H01J 27/022
9,818,570 B2 * 11/2017 Alvarado .................. H01J 1/22
2004/0149927 A1 * 8/2004 Iwasawa ................ H01J 37/08 250/426
2006/0163489 A1 * 7/2006 Low ........................ H01J 27/08 250/426
2009/0242793 A1 * 10/2009 Low ........................ H01J 37/16 250/424

(Continued)

FOREIGN PATENT DOCUMENTS

WO 2017/079588 A1 5/2017
WO 2017/176675 A1 10/2017

*Primary Examiner* — David A Vanore
(74) *Attorney, Agent, or Firm* — Nields, Lemack & Frame, LLC

(57) ABSTRACT

An ion source having a thermally isolated repeller is disclosed. The repeller comprises a repeller disk and a plurality of spokes originating at the back surface of the repeller disk and terminating in a post. In certain embodiments, the post may be hollow through at least a portion of its length. The use of spokes rather than a central stem may reduce the thermal conduction from the repeller disk to the post. By incorporating a hollow post, the thermal conduction is further reduced. This configuration may increase the temperature of the repeller disk by more than 100° C. In certain embodiments, radiation shields are provided on the back surface of the repeller disk to reduce the amount of radiation emitted from the sides of the repeller disk. This may also help increase the temperature of the repeller. A similar design may be utilized for other electrodes in the ion source.

21 Claims, 8 Drawing Sheets

(56) References Cited

U.S. PATENT DOCUMENTS

| | | | | |
|---|---|---|---|---|
| 2010/0051825 | A1* | 3/2010 | Yamashita | H01J 27/14 250/423 R |
| 2017/0133193 | A1* | 5/2017 | Colvin | H01J 37/3171 |
| 2017/0221669 | A1* | 8/2017 | Chaney | H01J 27/205 |
| 2017/0287579 | A1* | 10/2017 | Colvin | H01J 37/08 |
| 2019/0139742 | A1 | 5/2019 | McLaughlin et al. | |

* cited by examiner

THERMALLY ISOLATED REPELLER AND ELECTRODES

FIELD

Embodiments of the present disclosure relate to thermal isolated repellers and electrodes for use in an ion source, and more particularly, repellers and electrodes for use in high temperature applications using an indirectly heated cathode (IHC) ion source.

BACKGROUND

Various types of ion sources may be used to create the ions that are used in semiconductor processing equipment. For example, Freeman ion sources operate by supplying a current to a filament that passes from one end of the chamber to the opposite end. A Bernas ion source and a Calutron ion source operate by supplying a current to a filament that is disposed near one end of the chamber. In each of these sources, the filament emits thermionic electrons that are emitted into the chamber. These electrons collide with the feed gas to create a plasma.

Another type of ion source is the indirectly heated cathode (IHC) ion source. IHC ion sources operate by supplying a current to a filament disposed behind a cathode. The filament emits thermionic electrons, which are accelerated toward and heat the cathode, in turn causing the cathode to emit electrons into the chamber of the ion source. Since the filament is protected by the cathode, its life may be extended relative to a Bernas ion source. The cathode is disposed at one end of a chamber. A repeller is typically disposed on the end of the chamber opposite the cathode. The cathode and repeller may be biased so as to repel the electrons, directing them back toward the center of the chamber. In some embodiments, a magnetic field is used to further confine the electrons within the chamber.

In certain embodiments of these ion sources, side electrodes are also disposed on one or more walls of the chamber. These side electrodes may be biased so as to control the position of ions and electrons, so as to increase the ion density near the center of the chamber. An extraction aperture is disposed along another side, proximate the center of the chamber, through which the ions may be extracted.

When generating ions, the species of the desired ions may influence the optimal temperature. For example, for certain species, it may be preferably to maintain the ion source at a relatively low temperature. In other embodiments, such as the ionization of carbon-based species, a higher temperature may be desirable to minimize deposition within the chamber.

Maintaining a high temperature within the chamber may be problematic. While the temperature of the components within the arc chamber are often controlled by the amount of power dissipated by the filament, the temperature of each component is limited by the amount of thermal radiation emitted and the amount of conduction that draws heat away from these components through mating components. For example, the repeller and the electrodes may be physically attached to clamps located external to the ion source that are used to hold them in place. These clamps may be constructed from metal and may be affixed to a cooler component, such as the arc chamber base. This thermal path creates a thermal draw away from the repeller and the electrodes that cause them to operate at a lower temperature than desired.

Therefore, an ion source having a thermally isolated repeller may be beneficial. Further, it would be advantageous if the ion source also included thermally isolated electrodes. By thermally isolating these components, the temperature of the repeller may be maintained at a higher temperature than would otherwise be possible.

SUMMARY

An ion source having a thermally isolated repeller is disclosed. The repeller comprises a repeller disk and a plurality of spokes originating at the back surface of the repeller disk and terminating in a post. In certain embodiments, the post may be hollow through at least a portion of its length. The use of spokes rather than a central stem may reduce the thermal conduction from the repeller disk to the post. By incorporating a hollow post, the thermal conduction is further reduced. This configuration may increase the temperature of the repeller disk by more than 100° C. In certain embodiments, radiation shields are provided on the back surface of the repeller disk to reduce the amount of radiation emitted from the sides of the repeller disk. This may also help increase the temperature of the repeller. A similar design may be utilized for other electrodes in the ion source.

According to one embodiment, a repeller for use in an ion source is disclosed. The repeller comprises a repeller disk adapted to be disposed within the ion source, having a thickness, a front surface, a back surface, an outer edge; and a central axis; a post for attachment to a clamp; and a plurality of spokes extending outward from the post to the repeller disk and contacting the back surface of the repeller disk at locations different from the central axis of the repeller disk. In certain embodiments, the repeller comprises a unitary component. In certain embodiments, the back surface of the repeller disk comprises one or more radiation shields. In certain further embodiments, the radiation shields comprise one or more concentric grooves disposed proximate an outer edge of the repeller disk. In certain further embodiments, the radiation shields comprise one or more cavities disposed proximate an outer edge of the repeller disk. In some further embodiments, the cavities are arranged in one or more concentric rings. In some embodiments, the cavities extend at least 50% of the thickness of the repeller disk. In some embodiments, at least a portion of the post is hollow. In certain further embodiments, the cross-section of the hollow portion comprises an annular ring. In other further embodiments, the hollow portion comprises spoke extensions, each corresponding to a respective spoke, which are disposed between a solid portion of the post and the spokes and extend parallel to a central axis of the post.

According to another embodiment, an ion source is disclosed. The ion source comprises a chamber, comprising a plurality of walls and a first end and a second end, where the second end comprises a hole; a cathode disposed on the first end of the chamber; and a repeller disposed on the second end of the chamber; wherein the repeller comprises: a repeller disk disposed within the chamber, having a thickness, a front surface, a back surface, an outer edge; and a central axis; a post; and a plurality of spokes extending outward from the post to the repeller disk which contact a back surface of the repeller disk at locations different from a central axis of the repeller disk. In certain embodiments, the spokes are disposed within the chamber. In certain embodiments, the ion source further comprises a clamp external to the chamber, attached to the post and for supporting the repeller, wherein a portion of the post between the clamp and the repeller disk is hollow. In certain embodiments, spoke extensions extend from a solid portion of the post disposed proximate the clamp to the spokes and extend parallel to a central axis of the post. In some embodiments, the ion source further comprises an electrode disposed on a wall of the chamber, the electrode comprising: an electrode plate disposed within the chamber, having a thickness, a front surface, a back surface, an outer edge and a central axis; an electrode post for attachment to a clamp; and a plurality of spokes extending outward from the electrode post to the electrode plate which contact the back surface of the electrode plate at locations different from the central axis of the electrode plate.

According to another embodiment, an electrode for use within an ion source is disclosed. The electrode comprises an electrode plate adapted to be disposed within the ion source, having a thickness, a front surface, a back surface, an outer edge; and a central axis; a post for attachment to a clamp; and a plurality of spokes extending outward from the post to the electrode plate and contacting the back surface of the electrode plate at locations different from the central axis of the electrode plate. In certain embodiments, the electrode comprises a unitary component. In certain embodiments, the back surface of the electrode plate comprises one or more radiation shields. In certain embodiments, the radiation shields comprise one or more grooves or cavities disposed proximate an outer edge of the electrode plate. In certain embodiments, at least a portion of the post is hollow and wherein the hollow portion comprises spoke extensions, each corresponding to a respective spoke, which are disposed between a solid portion of the post and the spokes and extend parallel to a central axis of the post.

BRIEF DESCRIPTION OF THE FIGURES

For a better understanding of the present disclosure, reference is made to the accompanying drawings, which are incorporated herein by reference and in which.

DETAILED DESCRIPTION

As described above, it may be beneficial to operate ion sources, and particularly indirectly heated cathode (IHC) ion sources, at elevated temperatures in certain situations. However, the repeller and electrodes conduct a significant amount of heat away from the chamber. The present disclosure describes a new repeller and electrode design that minimizes this loss of heat. A new repeller and electrode design that creates thermal non-uniformity on the surface of the repeller disk or electrode plate is also described.

Figure 1:
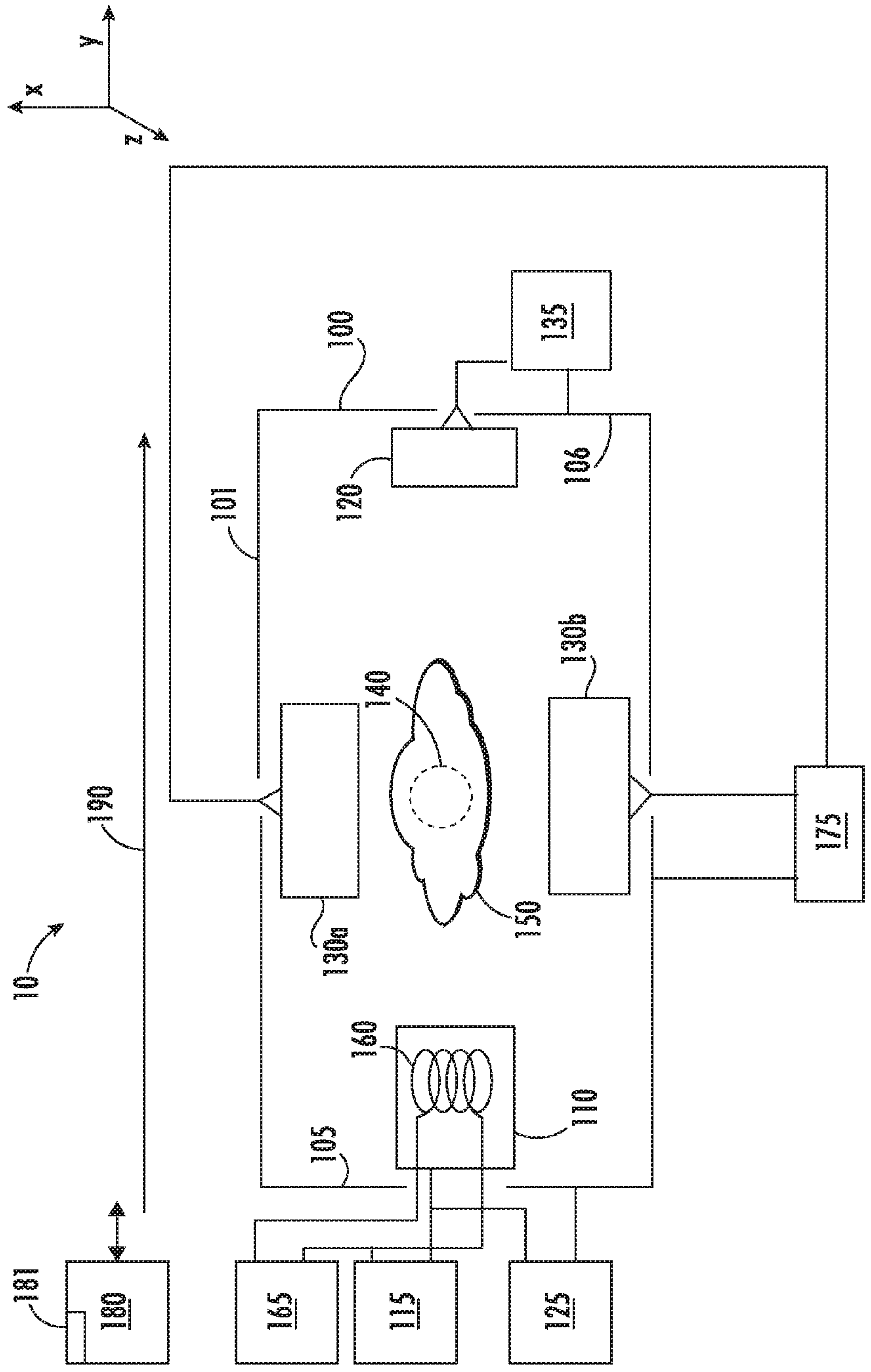
FIG. 1 is an ion source that may utilize the repeller and electrode design described herein in accordance with one embodiment.
Figure 2:
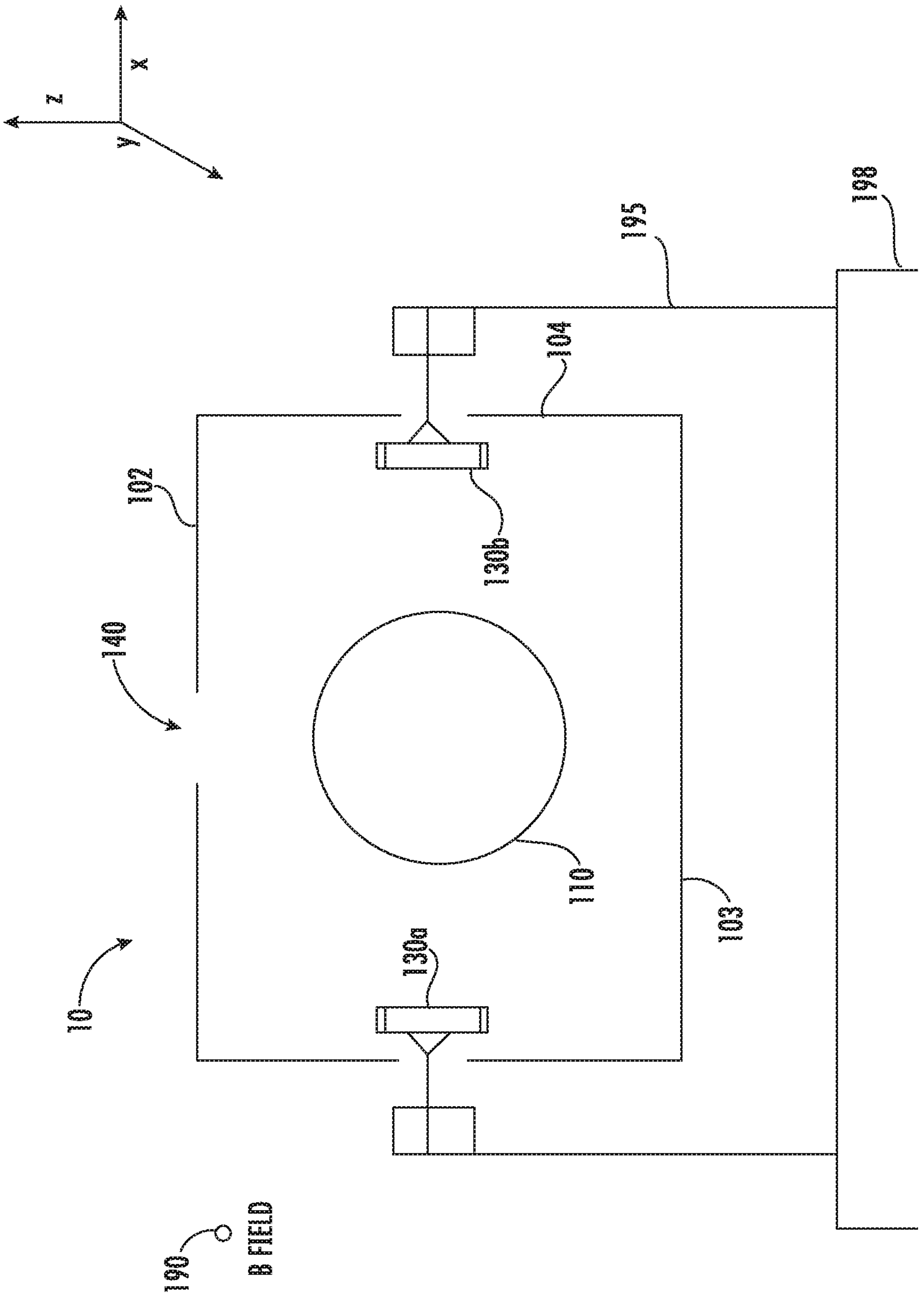
FIG. 2 is a cross-sectional view of the ion source of FIG. 1.

FIG. 1 shows an ion source 10 that includes a repeller 120 and electrodes 130*a*, 130*b* that reduce thermal loss. FIG. 2 shows a cross-section of the ion source of FIG. 1. The ion source 10 may be an indirectly heated cathode (IHC) ion source. The ion source 10 includes a chamber 100, comprising two opposite ends, and walls 101 connecting to these ends. These walls 101 include side walls 104, an extraction plate 102 and a bottom wall 103 opposite the extraction plate 102. The walls 101 of the chamber 100 may be constructed of an electrically conductive material and may be in electrical communication with one another. A cathode 110 is disposed in the chamber 100 at a first end 105 of the chamber 100. A filament 160 is disposed behind the cathode 110. The filament 160 is in communication with a filament power supply 165. The filament power supply 165 is configured to pass a current through the filament 160, such that the filament 160 emits thermionic electrons. Filament bias power supply 115 biases filament 160 negatively relative to the cathode 110, so these thermionic electrons are accelerated from the filament 160 toward the cathode 110 and heat the cathode 110 when they strike the back surface of cathode 110. The filament bias power supply 115 may bias the filament 160 so that it has a voltage that is between, for example, 200V to 1500V more negative than the voltage of the cathode 110. The cathode 110 then emits thermionic electrons on its front surface into chamber 100.

Thus, the filament power supply 165 supplies a current to the filament 160. The filament bias power supply 115 biases the filament 160 so that it is more negative than the cathode 110, so that electrons are attracted toward the cathode 110 from the filament 160. In certain embodiments, the cathode 110 is also in communication with a cathode bias supply 125. In other embodiments, the cathode 110 may be grounded. In certain embodiments, the chamber 100 is connected to electrical ground. In certain embodiments, the walls 101 provide the ground reference for the other power supplies.

In this embodiment, a repeller 120 is disposed in the chamber 100 on the second end 106 of the chamber 100 opposite the cathode 110. As the name suggests, the repeller 120 serves to repel the electrons emitted from the cathode 110 back toward the center of the chamber 100. For example, in certain embodiments, the repeller 120 may be biased at a negative voltage relative to the chamber 100 to repel the electrons using a repeller power supply 135. For example, in certain embodiments, the repeller power supply 135 supply a voltage in the range of 0 to −150V, although other voltages may be used. In these embodiments, the repeller 120 is biased at between 0 and −150V relative to the chamber 100. In certain embodiments, the repeller 120 may be floated relative to the chamber 100. In other words, when floated, the repeller 120 is not electrically connected to the repeller power supply 135 or to the chamber 100. In this embodiment, the voltage of the repeller 120 tends to drift to a voltage close to that of the cathode 110. In other embodiments, the repeller 120 may be electrically connected to the cathode bias supply 125 or to ground.

In certain embodiments, a magnetic field 190 is generated in the chamber 100. This magnetic field is intended to confine the electrons along one direction. The magnetic field 190 typically runs parallel to the side walls 104 from the first end 105 to the second end 106. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

In the embodiment shown in FIG. 1, first electrode 130*a* and second electrode 130*b* may be disposed on side walls 104 of the chamber 100, such that the electrodes 130*a*, 130*b* are within the chamber 100. The electrodes may each be in electrical communication with a power supply, such as electrode power supply 175. FIG. 2 shows a cross-sectional view of the ion source 10 of FIG. 1. In this figure, the cathode 110 is shown against the first end 105 of the ion source 10. First electrode 130*a* and second electrode 130*b* are shown on opposite side walls 104 of the chamber 100. The magnetic field 190 is shown directed out of the page, in the Y direction. In certain embodiments, the electrodes 130*a*, 130*b* may be separated from the side walls 104 of the chamber 100 through the use of insulators. Electrical connections from the electrode power supply 175 may be made to the first electrode 130*a* and the second electrode 130*b* by passing a conductive material from the exterior of the chamber 100 to the respective electrode.

Each of the cathode 110, the repeller 120, the first electrode 130*a* and the second electrode 130*b* is made of an electrically conductive material, such as a metal. Each of these components may be physically separated from the walls 101, so that a voltage, different from ground, may be applied to each component.

Disposed on the extraction plate 102, may be an extraction aperture 140. In FIG. 1, the extraction aperture 140 is disposed on a side that is parallel to the X-Y plane (parallel to the page). Further, while not shown, the ion source 10 also comprises a gas inlet through which the gas to be ionized is introduced to the chamber 100.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

In operation, electrons are emitted by the cathode 110. These electrons may be constrained by the magnetic and electrical fields within the chamber 100 so as to collide with the feed gas to create a plasma 150. Electrodes outside the chamber 100 may be used to extract ions from the plasma 150 through the extraction aperture 140.

As described above, in certain embodiments, it is advantageous to operate the ion source at elevated temperatures. These elevated temperatures may help prevent the deposition of material on the components within the chamber 100. For example, when ionizing carbon-based species, the carbon tends to accumulate on interior surfaces, the repeller 120 and the electrodes 130*a*, 130*b*. One way to minimize this deposition is to increase the temperature within the chamber 100 and particularly, the temperatures of the repeller 120 and the electrodes 130*a*, 130*b*.

As noted above, the repeller 120 and the electrodes 130*a*, 130*b* may be attached to external clamps 195 (see FIG. 2) that are supported by the chamber base 198, which may be at a lower temperature, such as less than 400° C. However, it may be desirable to maintain the repeller 120 and the electrodes 130*a*, 130*b* at temperatures closer to the temperature within the chamber 100, which may be 600° C. or more.

Figure 3A:
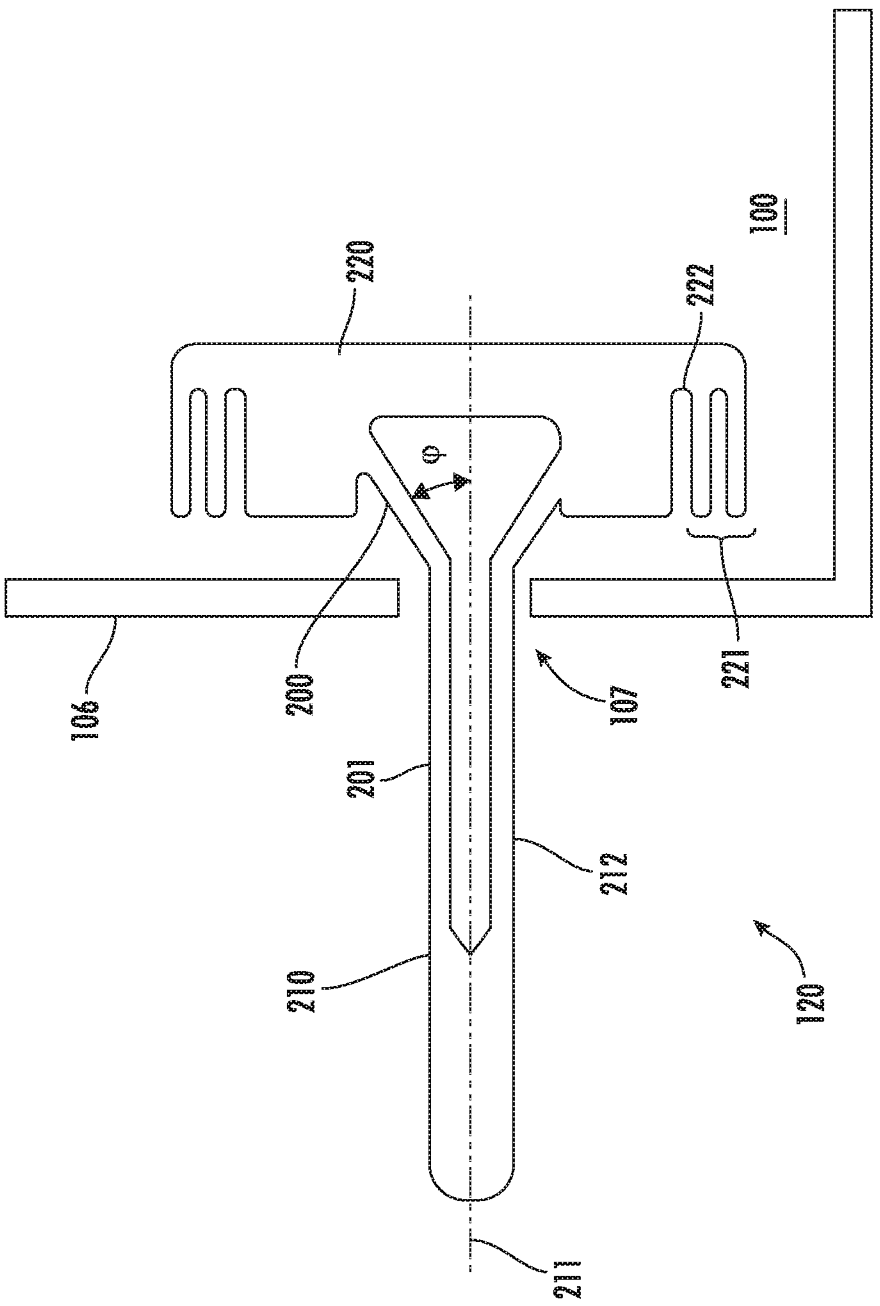
FIG. 3A is a cross-sectional view of the repeller in accordance with an embodiment.
Figure 3B:
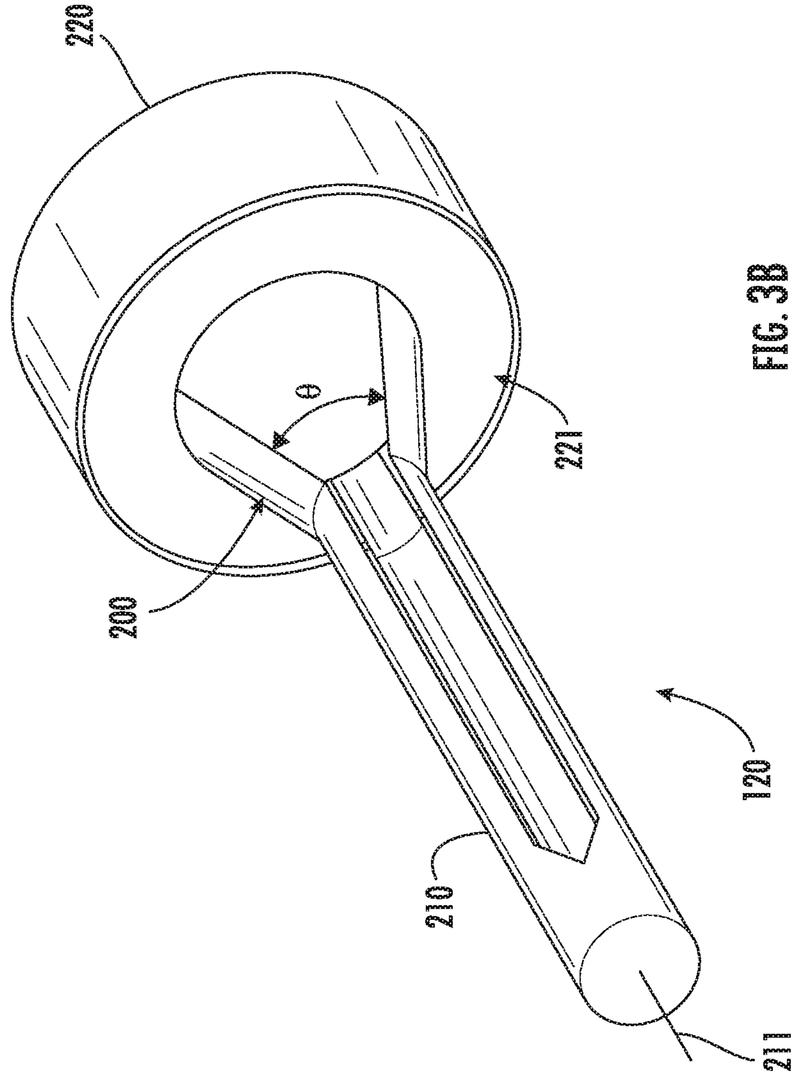
FIG. 3B is an isometric view of the repeller in accordance with an embodiment.

Several modifications can be made to the design of the repeller 120 and the electrodes 130*a*, 130*b* to achieve this goal. A cross-sectional view of a repeller 120 having these modifications is shown in FIG. 3A. An isometric view of the repeller 120 is shown in FIG. 3B. First, in contrast with traditional repellers which have a central stem that is press fit into the back of the circular disk, the present repeller 120 utilizes a spoke structure. Specifically, a plurality of spokes 200 project outward from the post 210. The post 210 may be concentric with the repeller disk 220 which may be circular or cylindrical. While the post 210 is shown as being a straight cylindrical component, it is understood that the post 210 may bend or curve to attach with the external clamp 195. Further, the cross-section of the post 210 may not be circular in some embodiments.

Furthermore, even though the term "disk" is used, it is understood that the repeller disk may take other shapes, such as square, rectangular, D-shaped or other shapes.

These spokes 200 may project outwardly at an angle $\varphi$ relative to the central axis 211 of the post 210 from the post 210 toward the outer edge of the repeller disk 220. By projecting the spokes at an angle $\varphi$, the length of the spoke from the post 210 to the repeller disk 220 is increased. For example, if each spoke 200 extends at an angle of $\varphi=45°$ relative to the central axis 211 of the post 210, the spokes 200 are 41% longer than they would otherwise be. This increase in the length of the spokes 200 decreases the conductivity. Of course, other values of $\varphi$ may also be used. Furthermore, it is possible that each spoke 200 projects at a different angle from the central axis 211. In other words, the spokes 200 extends from the post 210 to the back surface of the repeller disk and connects to the back surface at a location different from the central axis of the repeller disk 220.

The configuration of the spokes 200 may be limited by the chamber 100. For example, typically, a hole 107 may be disposed in the second end 106 of the chamber 100 that allows the stem of the repeller to pass through. The diameter of this hole 107 may be optimized as so to be as small as practical to minimize the amount of gas that leaks through the hole 107, while preventing arcing. Therefore, in certain embodiments, the outward extension of the spokes 200 occurs within the chamber 100 before the hole 107.

In other embodiments, the diameter of the hole 107 may be larger such that the outward extension of the spokes 200 begins outside of the chamber 100.

The spokes 200 may have any suitable shaped cross-section, such as but not limited to circular, rectangular, hexagonal, honeycomb, oval, and triangular.

Because the repeller 120 is electrically biased, the spokes 200 are constructed of an electrically conductive material, such as a metal.

Figure 4:
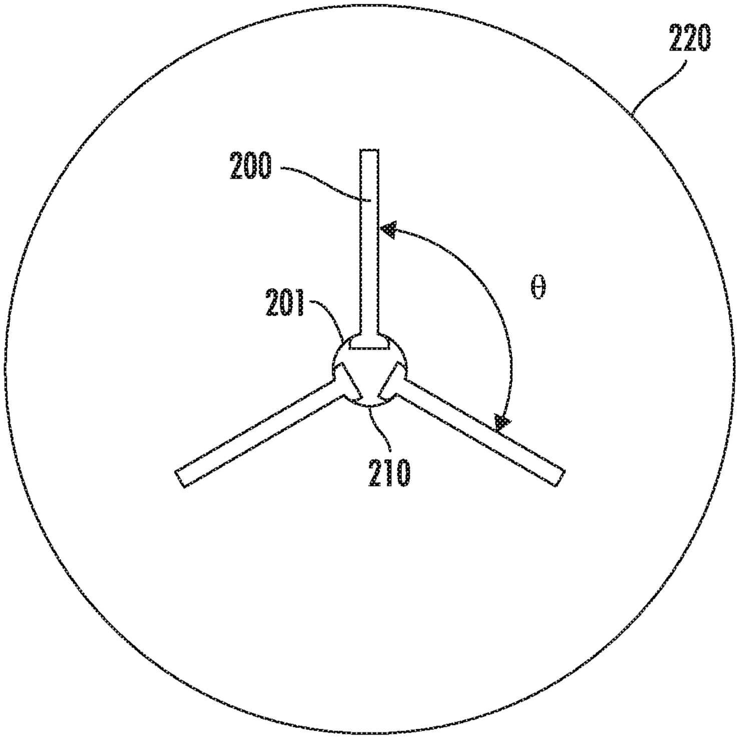
FIG. 4 is a rear view of the repeller of FIGS. 3A-3B.

In certain embodiments, the spokes 200 are equidistant from one another. In other words, the angular distance between adjacent spokes 200 may be the same angle, $\theta$. For example, as shown in FIG. 4, if there are three spokes 200, these spokes 200 may be separated by $\theta=120°$. If four spokes are used, the spokes 200 may be separated by $\theta=90°$. In other words, for N spokes, the angular separation may be $\theta=360°/N$. By making the spokes equidistant, the repeller disk 220 may be optimally supported. Further, thermal uniformity may be improved.

In certain embodiments, the thermal conductivity to the external clamp is further reduced. As shown in FIG. 3A, a portion of the post 210, closest to the repeller disk 220, may be hollow. In other words, the distal end of the post 210 may be solid. The hollow portion 212 may be disposed between the spokes 200 and the solid portion. In one embodiment, the hollow portion 212 of the post 210 is an annular ring. In this way, the amount of conductive material may be significantly reduced. For example, assume a post having an outer radius of R. The cross-sectional area of the post is simply $\pi R^2$. If the post is now made hollow with an inner radius of r, the cross-sectional area of the hollow post is now $\pi(R^2-r^2)$. If the inner radius is 70% of the outer radius (i.e. r=0.7*R), the cross-sectional area is reduced by half. This further reduces the amount of heat that is transferred to the external clamp 195.

However, the hollow portion 212 may not be an annular ring. For example, in one embodiment, the spoke extensions 201 extend from the solid portion of the post 210 for a distance before extending outwardly. These spoke extensions 201 extend parallel to the central axis. For example, FIGS. 3A-3B and FIG. 4 show the spoke extensions 201 along only a portion of the circumference of the post 210. A spoke extension 201 corresponds to a respective spoke 200 and extends parallel to the post from the solid end of the post 210 to the spokes 200.

While this portion is referred to as hollow, it is understood that material, different from the rest of the post 210, may disposed in this region. For example, the solid portion of the post 210 may be constructed of a solid metal, while the hollow portion 212 may contain powder or binder, as described in more detail below. Thus, the term "hollow portion" denotes that this portion is not made of solid metal.

The use of spokes 200 and optionally a hollow portion 212 of the post 210 may reduce the amount of heat that is transferred from the repeller disk 220 to the external clamp 195. Thus, these two modifications address the issue of thermal conduction from the repeller disk 220 to the external clamp 195.

Additional modifications may be incorporated to reduce the thermal radiation from the sides of the repeller disk 220. Specifically, when the repeller 120 is heated, some of the heat radiates from the sides of the repeller disk 220 toward the walls 101 of the ion source 10. This radiation lowers the temperature of the repeller disk 220. Furthermore, this radiation also contributes to temperature non-uniformity of the repeller disk 220. Because heat radiates from the sides of the repeller disk 220 and heat is conducted through the post 210, it is common for the center of the front surface of the repeller disk 220 to be at a different temperature than the outer edges of the front surface of the repeller disk 220.

To reduce the amount of radiation emitted from the sides of the repeller disk 220, radiation shields 221 may be used. These radiation shields 221 reduce the conduction path to the sides of the repeller disk 220. For example, FIGS. 3A and 3B show radiation shields 221, in the form of grooves 222 that may be concentric. These grooves 222 may have a range of different depths. In one embodiment, shown in FIG. 3A, all grooves 222 have the same depth. In other embodiments, some of the grooves may be deeper or more shallow than other grooves 222. In certain embodiments, the ratio of the width of the groove 222 to its depth may be between 0.25:1 and 3:1, although other ratios may be used. In certain embodiments, the depth of the grooves 222 may be at least 25% of the total thickness of the repeller disk 220, although other depths may be used, such as 50%, 75% or more. The grooves 222 extend inward from the back surface of the repeller disk 220, such that the front surface of the repeller disk 220 is unaffected by the radiation shields 221.

FIG. 3A shows two concentric grooves 222 that serve as the radiation shields 221. However, the number of grooves 222 is not limited by this disclosure. Furthermore, the depth and width of each groove 222 may be the same or different from other grooves. In addition, in the case of more than two grooves, the spacing between adjacent grooves may be the same or may be different.

As can be seen in FIG. 3A, the conduction path from the center of the repeller disk 220 to the edges in significantly reduced through the use of grooves 222. This is because the thickness of the path to the sides of the repeller disk 220 is significantly reduced by the radiation shields 221.

Figure 5:
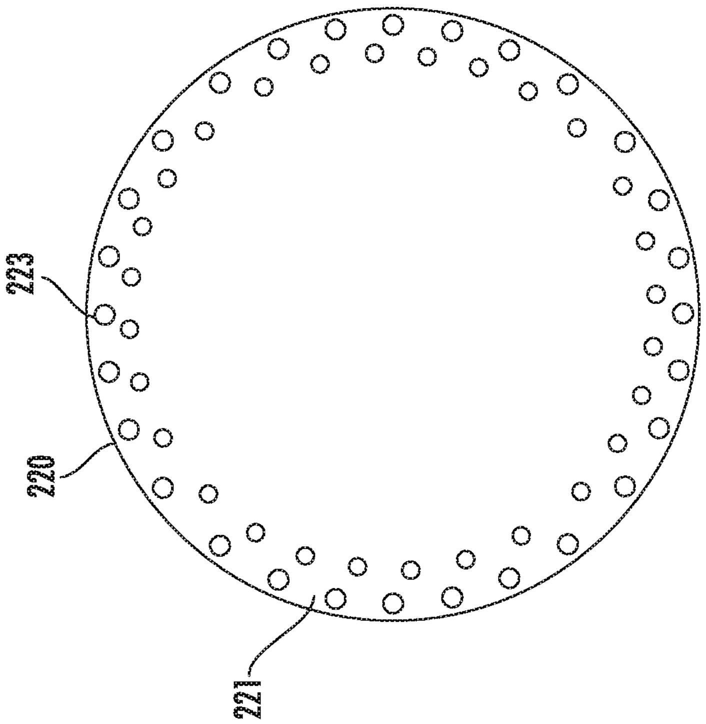
FIG. 5 shows a repeller disk having radiation shields according to one embodiment.

Of course, the radiation shields 221 may take on other forms as well. For example, FIG. 5 shows an embodiment where, rather than grooves, a plurality of cavities 223 are created on the back surface proximate the outer edge of the repeller disk 220. These cavities 223 may be circular, or may be any other shape. These cavities 223 reduce the thermal path from the center of the repeller disk 220 to the outer edge. While FIG. 5 shows two rings of cavities 223, it is understood that more or fewer rings may be employed. Further, as shown in FIG. 5, the cavities 223 in one ring may be offset from those in the adjacent ring. In other embodiments, the cavities 223 in adjacent rings may be aligned. Additionally, the size of the cavities 223 may be the same or may be different in different rings. In certain embodiments, the depth of the cavities 223 may be at least 50% of the thickness of the repeller disk 220, although other thicknesses may be used.

Figure 6:
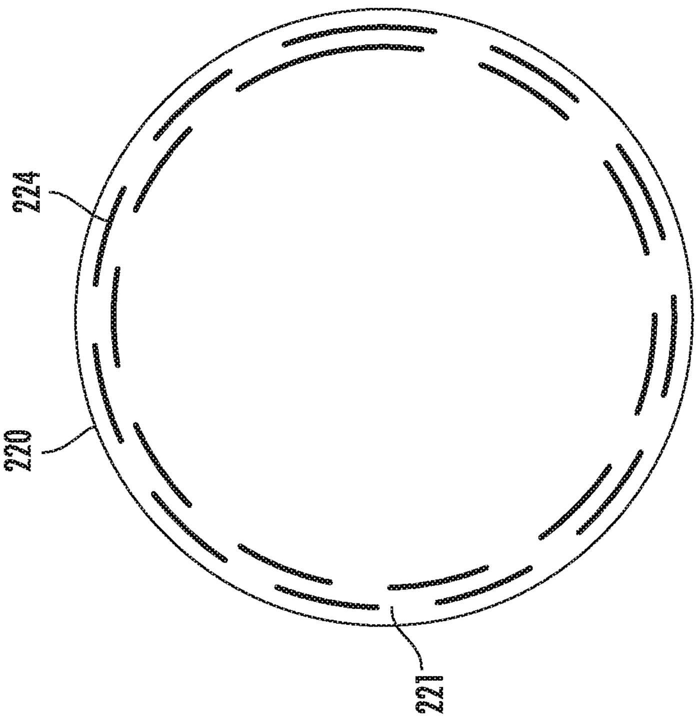
FIG. 6 shows a repeller disk having radiation shields according to another embodiment.

While FIG. 5 shows circular cavities, other shapes are also possible. For example, FIG. 6 shows curvilinear cavities 224 that are in the shape of a ring. Again, multiple rings may be used to further reduce the conduction path to the outer edges.

In all these embodiments, the radiation shield 221 comprises one or more cavities or grooves that extend into the repeller disk 220 from the back surface. These cavities or grooves may be disposed proximate the outer edge of the repeller disk 220. In other embodiments, the cavities or grooves may be disposed closer to the center of the repeller. These features decrease the thermal conduction toward the edge of the repeller disk 220, allowing more of the heat to remain concentrated in the center of the repeller disk 220.

The shape of the repeller 120 described herein may make its manufacture difficult using casting or conventional subtractive manufacturing techniques.

Additive manufacturing techniques allows a component to be manufactured differently. Rather than removing material as is traditionally done, additive manufacturing techniques create the component in a layer by layer fashion. One such additive manufacturing technique is known as Direct Metal Laser Sintering (DMLS) uses a powder bed and a laser. A thin layer of powder is applied to a workpiece space. A laser is used to sinter the powder, only in the areas where the component to be formed. The remainder of the metal powder remains and forms a powder bed. After the laser process is completed, another thin layer of metal powder is applied on top of the existing powder bed. The laser is again used to sinter specific locations. This process may be repeated an arbitrary number of times.

While DMLS is one technique, there are many others. For example, metal binder jetting is similar to DMLS, except that rather than using a laser to sinter the powder, a liquid binder to applied to the areas from which the component is to be formed. Another example of additive manufacturing is electron beam printing. In this embodiment, a thin filament of metal is extruded from a nozzle and a laser or electron beam is used to melt the metal as it is extruded. In this embodiment, the metal is only applied to those areas that are to become part of the component. Of course, other types of additive manufacturing, such as fused filament fabrication directed energy deposition or sheet lamination, may also be employed.

Because of the layer by layer fashion used to construct the component, shapes and other aspects, which are not possible with traditional subtractive manufacturing techniques, may be produced.

The repeller 120 shown in FIG. 2 may be manufactured using one or more of these additive manufacturing techniques. For example, the layer by layer process may commence with the front surface of the repeller 120 and grow the repeller from that surface.

In the DMLS manufacturing technique, it is possible that powder may be disposed or trapped within the hollow portion 212 of the post 210. Note that this powder has a lower thermal conductivity than the metal that is used to create the rest of the repeller 120. Therefore, although there in a material disposed in the hollow portion 212, that material is different from the rest of the post 210 and the thermal conductivity is reduced as compared to a solid post.

In certain embodiments, the repeller 120 is formed as a single unitary component. In other words, the repeller disk 220, the post 210 and the spokes 200 are all a single component. This repeller 120 may be constructed of tungsten, although other metals may also be used.

Figure 7A:
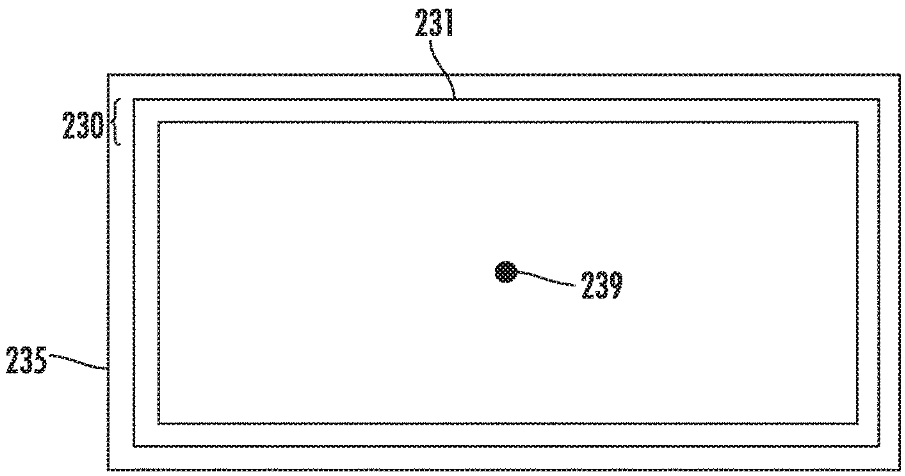
FIGS. 7A-7C show several embodiments of radiation shields for an electrode plate.
Figure 7B:
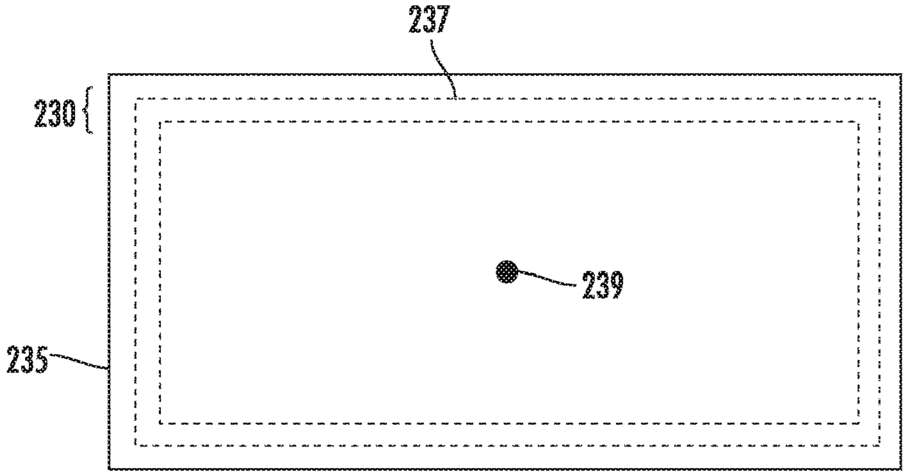
Figure 7C:
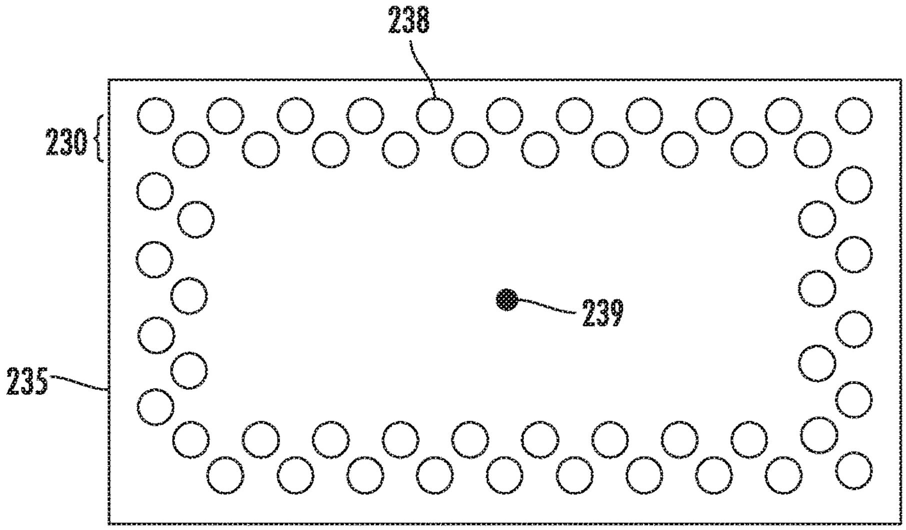

While the above disclosure describes the repeller 120, it is understood that one or more of the modifications described herein may also be applied to the electrodes 130*a*, 130*b*. In certain embodiments, the electrodes 130*a*, 130*b* may be rectangular or a different shape. Further, in certain embodiments, the front surface of the electrodes 130*a*, 130*b* may be concave or convex. In this scenario, the central axis is defined as the center of the electrode plate. For example, the central axis may be defined as the line through the plate that is equidistant to each corner of the plate. In this embodiment, the radiation shields may be concentric with the outer edge and have the same shape as the outer edge. In this context, "concentric" means that the radiation shields and the outer edge share a common central axis and a common shape. For example, the electrodes 130*a*, 130*b* may be rectangular. In this embodiment, the radiation shields may be concentric rectangular grooves, or a plurality of cavities arranged in one or more concentric rectangles. FIGS. 7A-7C show various embodiments of radiation shields that may be used with rectangular electrodes. In FIG. 7A, several grooves 231 are used as radiation shields 230 on the back surface of the electrode plate 235. These grooves 231 are concentric about central axis 239. In FIG. 7B, a plurality of linear cavities 237 that are in the shape of a rectangle are used as the radiation shields 230. Again, multiple rectangles may be used to further reduce the conduction path to the outer edges of the electrode plate 235. In FIG. 7C, a plurality of circular cavities 238 are used as the radiation shields 230. Again, multiple cavities may be used to further reduce the conduction path to the outer edges of the electrode plate 235.

While FIGS. 7A-7C show an electrode plate 235 that is rectangular, it is understood that other shapes may be used as well. For example, the electrode plate 235 may be oval, elliptical, round, and any suitable shape. In these embodiments, the radiation shields 230 may have the same shape as the electrode plate.

While the above disclosure described structural modifications to the repeller 120 to increase its temperature and improve its thermal uniformity, the modification described herein can be used to provide other characteristics. For example, it may be desirable to have a portion of the repeller disk 220 to be a different temperature than the rest of the repeller disk 220.

For example, assume that it is desirable to have a first portion of the repeller disk 220 be hotter than other portions of the repeller disk 220. Knowing that thermal energy is conducted by the spokes 200 and the post 210, the spokes 200 and spoke extensions 201 may be reconfigured so that:

- there are fewer spokes that terminate in this first portion;
- the cross-sectional area of the spokes that terminate near the first portion is smaller than that of other spokes; or
- the cross-sectional area of the spoke extensions 201 associated with any spoke terminating near the first portion is smaller than that of other spoke extensions.

If, instead, it is desirable that a second portion of the repeller disk 220 be cooler than other portions of the repeller disk 220, the opposite actions may be taken. In other words, the spokes 200 and the spoke extensions 201 may be reconfigured so that:

- there are more spokes that terminate in this second portion;
- the cross-sectional area of the spokes that terminate near the second portion is larger than that of other spokes; or
- the cross-sectional area of the spoke extensions 201 associated with any spoke terminating near the second portion is larger than that of other spoke extensions.

In other words, the spokes 200 may not be equidistant from one another, as shown in FIG. 4. To create a hot portion, the angular density of the spokes in the hot portion is less than in other portions. Similarly, to create a cold portion, the angular density of the spokes in the cold portion is greater than in other portions.

Additionally, knowing that thermal energy radiates from the edge of the repeller disk 220, modifications can be made to the radiation shields 221 to affect the temperature of portions of the repeller disk 220. Assume again that it is desirable to have a first portion of the repeller disk 220 be hotter than other portions of the repeller disk 220. Knowing that thermal energy is radiated by the edges of the repeller disk 220, the radiation shields may be reconfigured so that:

- there are more radiation shields in this first portion;
- the depth of the radiation shields in the first portion is greater than in other portions; or
- the width of the radiation shields in the first portion is greater than in other portions.

Conversely, if it is desirable for the second portion to be cooler than other portions, the radiation shields may be reconfigured so that:

- there are fewer or no radiation shields in this second portion;
- the depth of the radiation shields in the second portion is less than in other portions; or
- the width of the radiation shields in the second portion is less than in other portions.

In other words, in these embodiments, the radiation shields 221 may not be symmetric. For example, if grooves are used as radiation shields, the grooves may not concentric circles. Rather, one or more of the grooves may be C shaped. Similarly, if cavities are used, as shown in FIG. 5 or 6, the number of cavities may differ in different portions of the repeller disk 220.

These techniques may also be applied to the electrode plate 235, if desired.

As an example, it may be advantageous to maintain the extraction plate 102 at as high a temperature as possible. This may be to minimize deposition on the extraction plate 102. By modifying the spokes 200 and spoke extensions 201, the top half of the repeller disk 220 may be the hottest portion of the repeller disk 220. If the radiation shields 221 are reduced or eliminated from the top half of the repeller disk 220, this excess heat may radiate from the repeller disk 220 toward the extraction plate 102, further heating it. Similar techniques can be applied to the electrode plate 235 as well.

Figure 8:
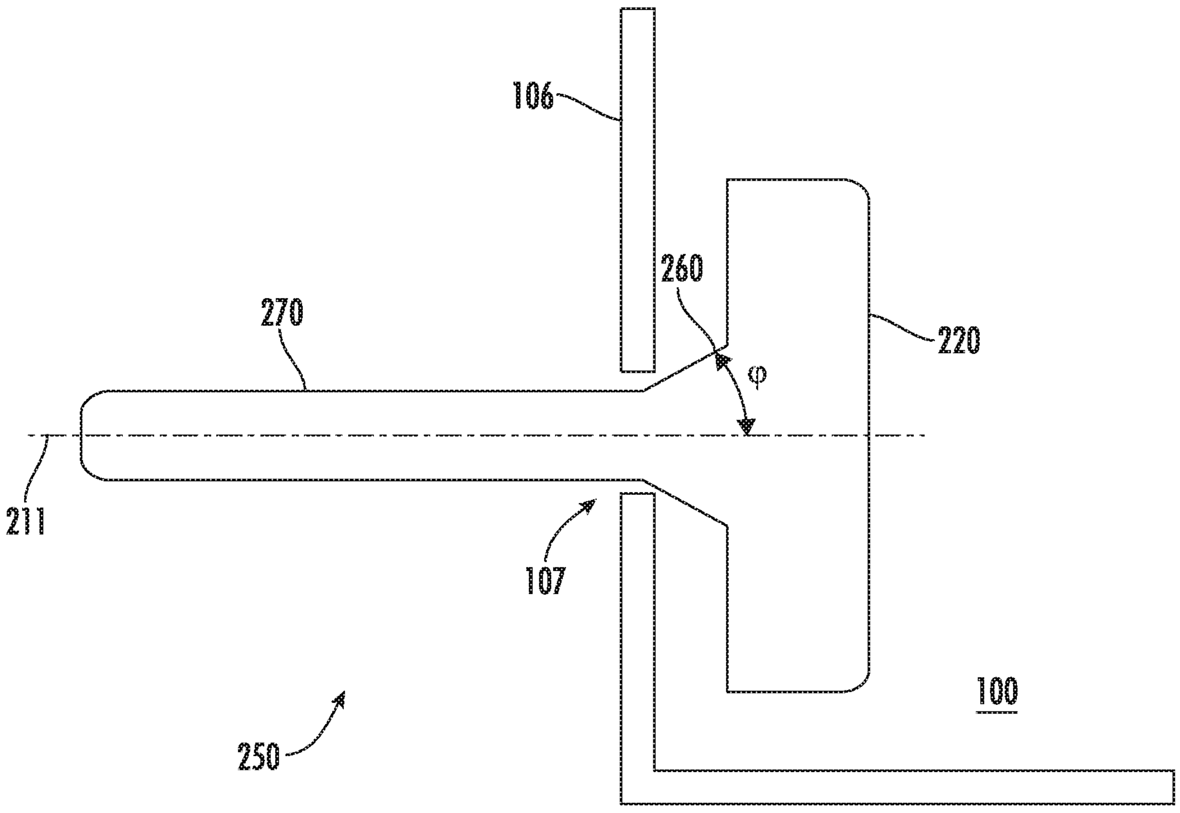
FIG. 8 is a cross-sectional view of the repeller in accordance with another embodiment.

In yet another embodiment, it may be advantageous to reduce the temperature of the repeller as much as possible. FIG. 8 shows a repeller 250 of one such embodiment. In this embodiment, the post may not have a hollow portion. Rather, a solid post 270 may better conduct thermal energy away from the repeller disk 220. Further, rather than individual spokes 200, the solid post 270 may attach to the repeller disk 220 using a solid flared end 260. In one embodiment, the portion of the solid post 270 that is within the chamber 100 is flared outward at an angle φ. This creates a larger contact area between the repeller disk 220 and the solid post 270, allowing more thermal energy to be conducted away from the repeller disk 220. This repeller 250 may be a unitary component, such that the solid post 270, the solid flared end 260 and the repeller disk 220 are all one component. To further decrease the temperature of the repeller disk 220, the repeller disk 220 may not have any radiation shields, allowing heat to radiate from the edge of the repeller disk 220. Similar techniques can be applied to the electrode plate 235 as well.

The embodiments described above in the present application may have many advantages. As described above, the spokes 200, the spoke extensions 201 and the radiation shields 221 may be used to increase the temperature of the repeller. In one test, the repeller 120 was constructed as shown in FIG. 3A. In a second test, a traditional repeller, having a solid circular disk with a press fit stem, was used. In both tests, it was assumed that 100 W/m$^2$ was applied to the front surface of the repeller disk. The external clamp 195, attached at the distal end of the post or stem, was assumed to be at 400° C. The internal temperature of the chamber was assumed to be 600° C. Tests shows that the temperature of the front surface of the repeller disk in the newly designed repeller increased more than 100° C. as compared to the traditional repeller. In other words, the new repeller design significantly reduced the conduction of heat to the external clamp 195. This increase in temperature may reduce deposition on the repeller, especially the deposition of carbon on the repeller. Additionally, no external heating elements or heating reflectors are used to maintain the temperature within the chamber. This simplifies the design and operation of the ion source.

In other embodiments, the spokes 200, the spoke extensions 201 and the radiation shields 221 may be designed so as to create thermal hot spots or cold spots on the surface of the repeller disk 220.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A repeller for use in an ion source, comprising:
- a repeller disk adapted to be disposed within the ion source, having a thickness, a front surface, a back surface, an outer edge; and a central axis;
- a post for attachment to a clamp; and
- a plurality of spokes extending outward from the post to the repeller disk and contacting the back surface of the repeller disk at locations different from the central axis of the repeller disk.

2. The repeller of claim 1, wherein the repeller disk, the post and the plurality of spokes are a unitary component.

3. The repeller of claim 1, wherein the back surface of the repeller disk comprises one or more radiation shields.

4. The repeller of claim 3, wherein the radiation shields comprise one or more concentric grooves disposed proximate an outer edge of the repeller disk.

5. The repeller of claim 3, the radiation shields comprise one or more cavities disposed proximate an outer edge of the repeller disk.

6. The repeller of claim 5, wherein the cavities are arranged in one or more concentric rings.

7. The repeller of claim 5, wherein the cavities extend at least 50% of the thickness of the repeller disk.

8. The repeller of claim 1, wherein at least a portion of the post is hollow.

9. The repeller of claim 8, wherein a cross-section of the hollow portion comprises an annular ring.

10. The repeller of claim 8, wherein the hollow portion comprises spoke extensions, each corresponding to a respective spoke, which are disposed between a solid portion of the post and the spokes and extend parallel to a central axis of the post.

11. The repeller of claim 1, wherein the repeller disk is round.

12. An ion source, comprising:
- a chamber, comprising a plurality of walls and a first end and a second end, where the second end comprises a hole;
- a cathode disposed on the first end of the chamber; and
- a repeller disposed on the second end of the chamber;
- wherein the repeller comprises:
  - a repeller disk disposed within the chamber, having a thickness, a front surface, a back surface, an outer edge; and a central axis;
  - a post; and
  - a plurality of spokes extending outward from the post to the repeller disk which contact a back surface of the repeller disk at locations different from a central axis of the repeller disk.

13. The ion source of claim 12, wherein the spokes are disposed within the chamber.

14. The ion source of claim 12, further comprising a clamp external to the chamber, attached to the post and for supporting the repeller, wherein a portion of the post between the clamp and the repeller disk is hollow.

15. The ion source of claim 14, wherein spoke extensions extend from a solid portion of the post disposed proximate the clamp to the spokes and extend parallel to a central axis of the post.

16. The ion source of claim 12, further comprising an electrode disposed on a wall of the chamber, the electrode comprising:

an electrode plate disposed within the chamber, having a thickness, a front surface, a back surface, an outer edge and a central axis;

an electrode post for attachment to a clamp; and a plurality of spokes extending outward from the electrode post to the electrode plate which contact the back surface of the electrode plate at locations different from the central axis of the electrode plate.

17. An electrode for use within an ion source, comprising:

an electrode plate adapted to be disposed within the ion source, having a thickness, a front surface, a back surface, an outer edge; and a central axis;

a post for attachment to a clamp; and three or more spokes extending outward from the post to the electrode plate and contacting the back surface of the electrode plate at locations different from the central axis of the electrode plate.

18. The electrode of claim 17, wherein the electrode plate, the post and the spokes are a unitary component.

19. The electrode of claim 17, wherein the back surface of the electrode plate comprises one or more radiation shields.

20. The electrode of claim 19, wherein the radiation shields comprise one or more grooves or cavities disposed proximate an outer edge of the electrode plate.

21. The electrode of claim 17, wherein at least a portion of the post is hollow and wherein the hollow portion comprises spoke extensions, each corresponding to a respective spoke, which are disposed between a solid portion of the post and the spokes and extend parallel to a central axis of the post.

* * * * *